United States Patent
Kang et al.

(10) Patent No.: US 7,002,186 B2
(45) Date of Patent: Feb. 21, 2006

(54) FLAT PANEL DISPLAY AND PROTECTION DEVICE THEREFOR

(75) Inventors: Tae-Wook Kang, Suwon-si (KR); Chang-Soo Kim, Suwon-si (KR); Chang-Yong Jeong, Suwon-si (KR)

(73) Assignee: Samsung SDI Co., Ltd., Suwon-si (KR)

(*) Notice: Subject to any disclaimer, the term of this patent is extended or adjusted under 35 U.S.C. 154(b) by 0 days.

(21) Appl. No.: 11/171,310

(22) Filed: Jun. 29, 2005

(65) Prior Publication Data

US 2005/0285134 A1   Dec. 29, 2005

(51) Int. Cl.
*H01L 29/22* (2006.01)
*H01L 29/227* (2006.01)

(52) U.S. Cl. .......................................... 257/99; 257/98
(58) Field of Classification Search ............... 257/88, 257/91, 95, 98, 99
See application file for complete search history.

(56) References Cited

U.S. PATENT DOCUMENTS

| | | | |
|---|---|---|---|
| 2003/0056392 A1* | 3/2003 | Boroson et al. | 34/335 |
| 2005/0110021 A1* | 5/2005 | Park et al. | 257/72 |
| 2005/0158893 A1* | 7/2005 | Silverbrook | 438/22 |
| 2005/0186760 A1* | 8/2005 | Hashimura et al. | 438/460 |

* cited by examiner

*Primary Examiner*—Ngân V. Ngô
(74) *Attorney, Agent, or Firm*—Christie, Parker and Hale, LLP

(57) ABSTRACT

A flat panel display includes a sealing substrate formed above a substrate on which a light-emitting device is formed, and a protection plate formed on the sealing substrate to protect the light-emitting device. A plurality of grooves are formed on an inner surface of the protection plate to increase the protection plate's resistance to bending, disperse the force of a load applied to the flat panel display, and decrease the possibility that the light-emitting device formed in the flat panel display will be damaged by the load.

20 Claims, 4 Drawing Sheets

FLAT PANEL DISPLAY AND PROTECTION DEVICE THEREFOR

CROSS REFERENCE

This application claims priority to and the benefit of Korean Patent Application No. 2004-0049821, filed on Jun. 29, 2004, in the Korean Intellectual Property Office, the entire content of which is incorporated herein by reference.

BACKGROUND OF THE INVENTION

1. Field of the Invention

The present invention relates to a flat panel display, and more particularly, to a flat panel display having a protection plate with an increased resistance to bending.

2. Description of Related Art

A conventional flat panel display is an organic light-emitting device that is able to be competitively priced. An organic light-emitting device is capable of being a light, thin, short and small display device since it has a fast response rate, superior luminance and a simple structure compared to a liquid crystal display light receiving device.

Organic light-emitting devices may become the next generation flat panel display following liquid crystal displays since the organic light-emitting device has various uses including in a hand-held device, an automobile navigation system, a laptop computer or a wall-hanging television or as a backlight.

An organic light-emitting device includes an organic layer for emitting light formed between an anode electrode to which a positive power source is applied and a cathode electrode to which a negative power source is applied, wherein holes transferred to the organic layer from the anode electrode are combined with electrons transferred to the organic layer from the cathode electrode so as to generate light.

FIG. 1 is a cross-sectional view showing a conventional flat panel display. Referring to FIG. 1, an organic light-emitting device having pixels is formed on a substrate 100. The pixels typically include anode electrodes, organic layers formed on the upper surface of the anode electrodes to generate red, green and blue lights by the flow of current, and cathode electrodes formed on the upper surface of the organic layer in such a way that the cathode electrodes and the anode electrodes intersect.

Pixels formed on the substrate 100 are sealed by a sealing substrate 110 to protect organic matter inside the pixels since the organic matter is considerably sensitive and reacts to humidity and active gases. A moisture absorbing material 120 is attached to the inner surface of the sealing substrate 110 to remove moisture inside the pixels.

Furthermore, a protection plate 130 is typically formed on the sealing substrate 110 to protect the organic light-emitting device from external pressure.

In a conventional organic light-emitting device, the surface of the protection plate 130 is typically flat. When a point load is applied to the protection plate 130, the protection plate and the sealing substrate 110 may be bent, resulting in contact between the moisture absorbing material 120 and cathode electrodes of the organic light-emitting device. This contact may damage the organic light emitting device and degrade the quality of the device.

Thus, there is a need for a flat panel display having a protection plate with improved resistance to bending.

SUMMARY OF THE INVENTION

A flat panel display with a protection plate having improved resistance to bending is provided, the protection plate having grooves on its lower surface.

An embodiment of the present invention includes a flat panel display having a sealing substrate formed above a substrate on which a device, such as an organic light-emitting device, is formed. The flat panel display also includes a protection plate formed on the sealing substrate to protect the device, wherein a plurality of grooves are formed on the lower surface of the protection plate. The grooves allow the protection plate to have a higher resistance to bending by allowing an external load applied to the flat panel display to be dispersed among the plurality of grooves.

The protection plate may be formed of metal, and the lower surface of the protection plate on which the plurality of grooves are formed may make contact with the sealing substrate.

The plurality of grooves may be formed in a linear shape, and the linear shaped plurality of grooves may be formed in a lengthwise or a widthwise direction.

The plurality of grooves may include at least one circular groove formed at the center of the protection plate and linear grooves formed radially around the circular groove.

The plurality of grooves may be formed in a semicircular cross-sectional shape, a semi-hexagonal cross-sectional shape, or a triangular cross-sectional shape. The sides of the type grooves may be inclined at an angle of between about 50 to 60 degrees, and the sides of the triangular grooves may be inclined at an angle of between about 80 to 90 degrees.

Thickness of the protection plate may be between about 0.9 to 1.5 mm, and the plurality of grooves may be formed by press forming or by an etching process.

DETAILED DESCRIPTION

Figure 1:
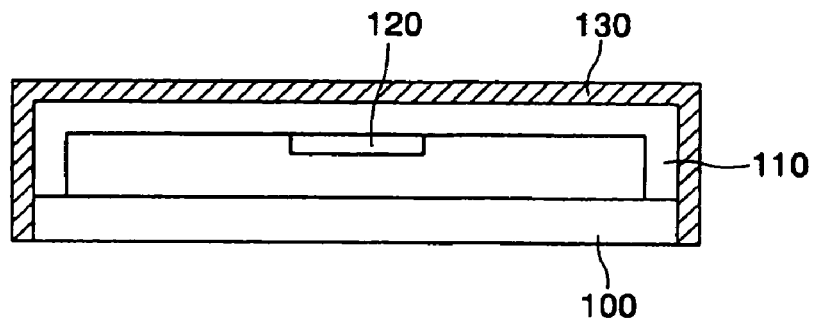
FIG. 1 is a cross sectional view showing a conventional flat panel display.
Figure 2A:
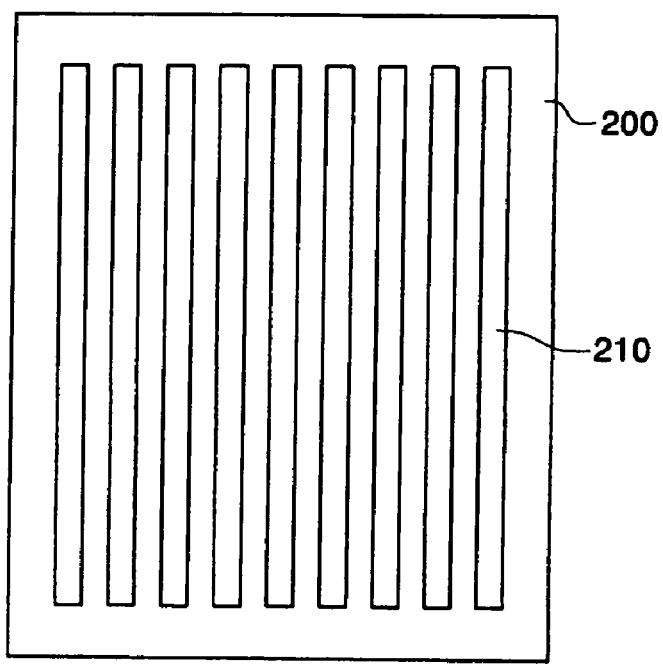
FIGS. 2A and 2B are a bottom view of protection plate and a left side view of a flat panel display, respectively, according to an embodiment of the present invention.

Referring to FIG. 2A, a plurality of grooves 210 are formed on the lower surface of a protection plate 200. The protection plate 200 may be made from a metal having high resistance to bending. Specifically, metals such as mild steel, brass and aluminum are frequently used as a material for the protection plate.

A beading process may be used to form the plurality of grooves. The beading process is a processing method of increasing the strength of a product by forming narrow zonal protrusions for reinforcement or deformation prevention on a sheet material. Forming grooves on a first surface of a material has the effect of forming protrusions on an opposite surface of the material.

The plurality of grooves may formed linearly, and the plurality of linear grooves are formed lengthwise on the material to be processed.

Figure 2B:
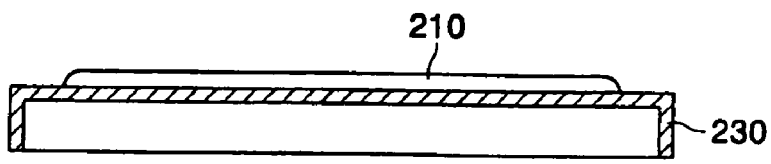

Referring to FIG. 2B, the grooves 210 protrude from the protection plate 230. An inside surface of the protection plate 230 on which the plurality of grooves 210 is formed contacts the sealing substrate. As described above, resistance to bending of the protection plate is increased by forming a plurality of protrusions 210 on the protection plate 230 so that an external load applied to the protection plate is dispersed by the plurality of protrusions.

Therefore, damage of a device due to contact between the device formed on a substrate and a moisture absorbing material 120 attached to the lower surface of the sealing substrate may be reduced. The bending strength of a material is the resistance to bending exerted by the material against an external load applied to the material.

In one exemplary embodiment, the thickness of the protection plate is between about 0.9 to 1.5 mm. A protection plate having a thickness of less than 0.9 mm may have too low of a bending strength. On the other hand, a protection plate having a thickness of greater than 1.5 mm may require a high pressure beading operation requiring a hydraulic press or other special equipment.

Press forming may also be used to form the plurality of grooves. Press forming is a method of fabricating a certain panel by plastically deforming a material to be formed in a shaped metallic mold after mounting the mold between press machines having corresponding halves. That is, press forming is a method of forming a shaped material through complicated processes using a press machine and a mold.

The plurality of grooves may also be formed through an etching process. Etching technology is a technology for processing and producing an ultra-fine precisely shaped product by photo sensing the shape of an artifact onto a dry film. The film is placed on the surface of a material, and the shape on the film is exposed onto the material using a precision photography technology, thereby forcibly injecting chemicals onto a portion that is not light-exposed, allowing the portion to be melted and removed.

Figure 3A:
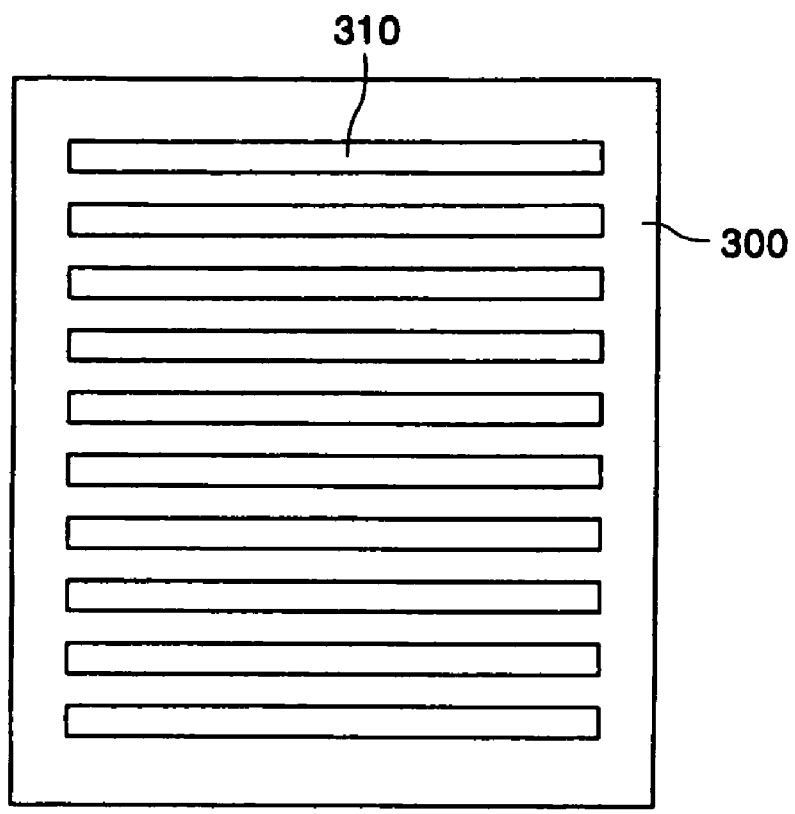
FIGS. 3A and 3B are a bottom view of protection plate and a side view of a flat panel display, respectively, according to another embodiment of the present invention.
Figure 3B:
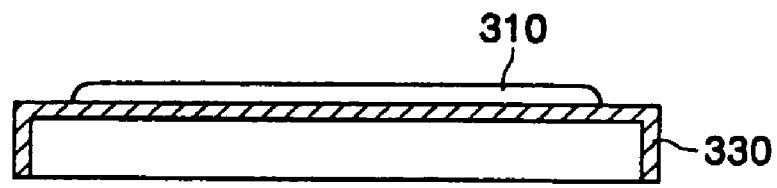

FIGS. 3A and 3B are a bottom view of a protection plate and a side view of a flat panel display, respectively, according to another exemplary embodiment of the present invention.

Referring to FIG. 3A, a plurality of grooves 310 are formed on the lower surface 300 of protection plate. The plurality of grooves are formed linearly in a widthwise direction.

Referring to FIG. 3B, it can be seen that protrusions 310 are formed on the protection plate 330. Other than the difference described above with respect to FIG. 3A, the flat panel display according to this exemplary embodiment of the present invention is the same as a flat panel display according to the previously described embodiment of the present invention.

Figure 4:
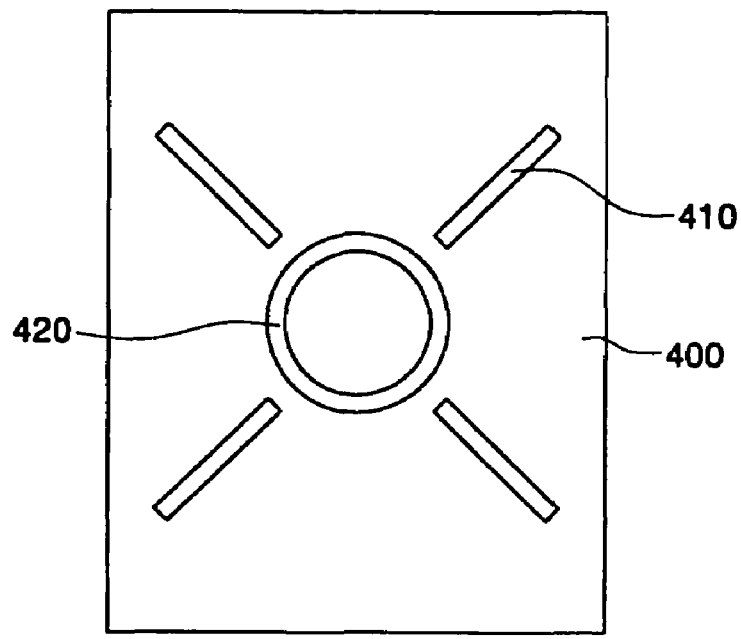
FIG. 4 is a bottom view of protection plate according to yet another embodiment of the present invention.

FIG. 4 is a bottom view of protection plate according to yet another exemplary embodiment of the present invention. A plurality of grooves are formed on the lower surface 400 of protection plate. A circular groove 420 is formed at the center of the lower surface of the protection plate, and four linearly shaped grooves 410 are formed radially around the circular groove.

Other than the difference described above with respect to FIG. 4, the flat panel display according to this exemplary embodiment of the present invention is the same as a flat panel display according to the previously described embodiments of the present invention.

Figure 5:
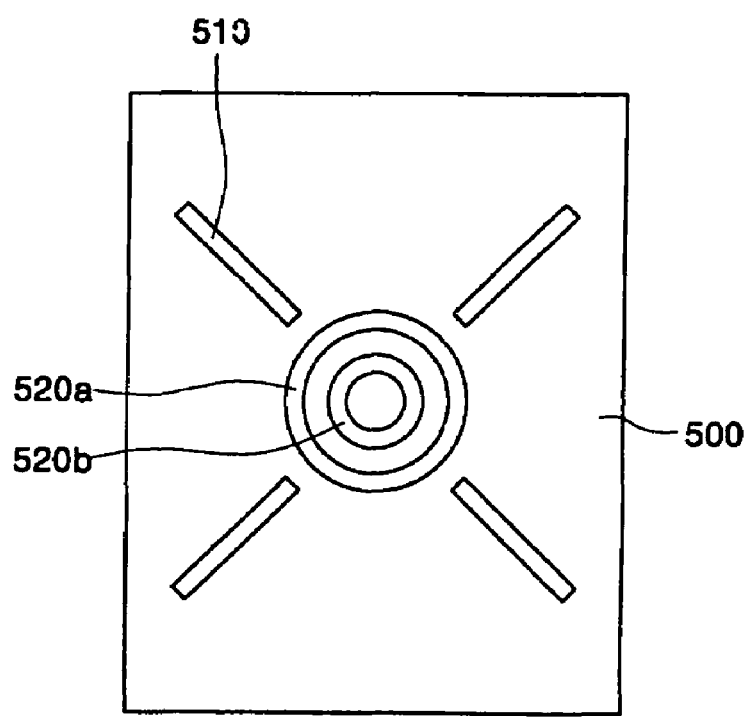
FIG. 5 is a bottom view of protection plate according to still another embodiment of the present invention.

FIG. 5 is a bottom view of protection plate according to yet another exemplary embodiment of the present invention. A plurality of grooves are formed on the lower surface 500 of protection plate. A circular groove 520a is formed at the center of the lower surface of the protection plate 500, and another circular groove 520b is formed concentrically within the circular groove 520a. Four linearly shaped grooves 510 are formed radially around the concentric circular grooves 520a, 520b. A flat panel display according to this exemplary embodiment has a protection plate 500 having increased resistance to bending due to its concentric circular grooves 520a, 520b which allow an external load to be further dispersed on the protection plate.

Furthermore, the protection plate 500 may have three or more concentric circular grooves formed on its lower surface.

Other than the difference described above with respect to FIG. 5, the flat panel display according to this exemplary embodiment of the present invention is the same as a flat panel display according to the previously described embodiments of the present invention.

Figure 6A:
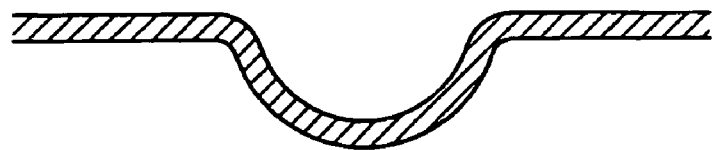
FIGS. 6A to 6C are cross-sectional views of grooves formed by exemplary embodiments of the present invention.
Figure 6B:
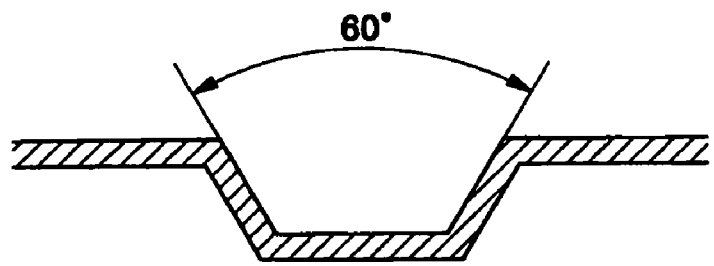
Figure 6C:
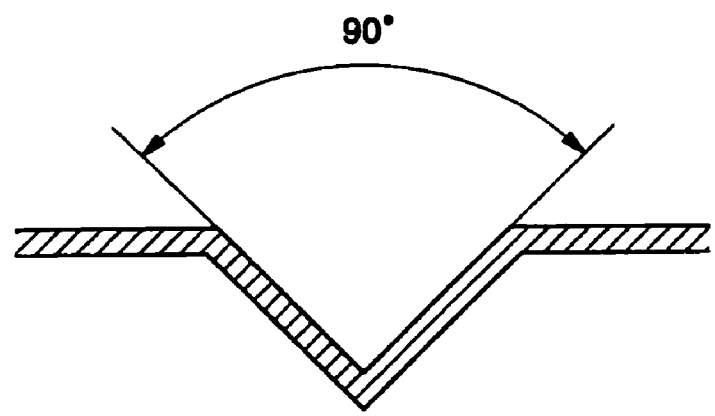

FIGS. 6A to 6C are cross-sectional views of grooves formed by the present invention. Referring to FIG. 6A, a cross-section of a groove is formed in a semicircular shape. Referring to FIG. 6B, a cross-section of a groove is formed in a semi-hexagonal shape. That is, a bottom part of the groove is flat while the sides of the groove are inclined. In one exemplary embodiment, the side of the groove is inclined to an angle about between about 50 to 60 degrees to improve the resistance to bending of the protection plate. Referring to FIG. 6C, it can be seen that cross-section of groove is formed in a triangle shape. In one exemplary embodiment, the sides of the groove are inclined to an angle of 80 to 90 degrees to improve resistance to bending of the protection plate.

As described above, the present invention provides a flat panel display capable of reducing damage of a certain device inside the flat panel display by forming a plurality of protrusions on a protection plate used to protect the device. An applied load is thereby dispersed through the plurality of protrusions so that the protection plate has a higher resistance to bending.

While the invention has been particularly shown and described with reference to exemplary embodiments thereof, it will be understood by those skilled in the art that the foregoing and other changes in form and details may be made herein without departing from the spirit and scope of the invention.

What is claimed is:

1. A flat panel display device comprising:
   a substrate on which a light-emitting device is formed;
   a sealing substrate formed above the substrate;
   and a protection plate formed on the sealing substrate to protect the light-emitting device;
   wherein the protection plate has a plurality of grooves formed on a protection plate surface.

2. The flat panel display device of claim 1, wherein the protection plate is made from metal.

3. The flat panel display device of claim 1, wherein the protection plate surface contacts the sealing substrate.

4. The flat panel display device of claim 1, wherein the plurality of grooves are formed in a linear shape.

5. The flat panel display device of claim 4, wherein the linearly shaped plurality of grooves are formed in a lengthwise direction.

6. The flat panel display device of claim 4, wherein the linearly shaped plurality of grooves are formed in a widthwise direction.

7. The flat panel display device of claim 1, wherein the plurality of grooves include one circular groove formed at the center of the protection plate and linear grooves radially formed around the circular groove.

8. The flat panel display device of claim 1, wherein the plurality of grooves include a plurality of circular grooves formed at the center of the protection plate and linear grooves radially formed around the circular grooves.

9. The flat panel display device of claim 1, wherein the plurality of grooves are formed in a semicircular cross-sectional shape.

10. The flat panel display device of claim 1, wherein the plurality of grooves are formed in a semi-hexagonal cross-sectional shape.

11. The flat panel display device of claim 10, wherein a side face of the semi-hexagonal cross-sectional shape is inclined to an angle between about 50 to 60 degrees.

12. The flat panel display device of claim 1, wherein the plurality of grooves are formed in a triangular cross-sectional shape.

13. The flat panel display device of claim 10, wherein a side face of the triangular cross-sectional shape is inclined to an angle of between about 80 to 90 degrees.

14. The flat panel display device of claim 1, wherein the thickness of the protection plate is between about 0.9 to 1.5 mm.

15. The flat panel display device of claim 1, wherein the plurality of grooves are formed through press forming.

16. The flat panel display device of claim 1, wherein the plurality of grooves are formed through an etching process.

17. The flat panel display device of claim 1, wherein the light-emitting device is an organic light-emitting device.

18. A flat panel display protection device for a flat panel display device having a substrate on which a light-emitting device is formed and a sealing substrate formed above the substrate, the flat panel display protection device comprising a protection plate formed on the sealing substrate to protect the light-emitting device, the protection plate having a plurality of grooves formed on a protection plate surface.

19. The flat panel display protection device of claim 18, wherein the protection plate is metal.

20. The flat panel display protection device of claim 18, wherein the protection plate surface contacts the sealing substrate.

* * * * *

UNITED STATES PATENT AND TRADEMARK OFFICE
CERTIFICATE OF CORRECTION

PATENT NO. : 7,002,186 B2
APPLICATION NO. : 11/171310
DATED : February 21, 2006
INVENTOR(S) : Kang et al.

It is certified that error appears in the above-identified patent and that said Letters Patent is hereby corrected as shown below:

On the Title Page

(30) Foreign Application Priority Data     Insert --(30) Foreign Application Priority Data June 29, 2004 (KR) ............. 10-2004-0049821--

Signed and Sealed this

Third Day of October, 2006

JON W. DUDAS
*Director of the United States Patent and Trademark Office*